US007397324B2

(12) United States Patent
Tang et al.

(10) Patent No.: US 7,397,324 B2
(45) Date of Patent: Jul. 8, 2008

(54) MULTILAYER CHIP-TYPE TRIPLEXER

(75) Inventors: Ching-Wen Tang, Nan-Tou (TW); Sheng-Fu You, Chang-Hua Hsien (TW)

(73) Assignee: Industrial Technology Research Institute, Hsinchu (TW)

( * ) Notice: Subject to any disclaimer, the term of this patent is extended or adjusted under 35 U.S.C. 154(b) by 183 days.

(21) Appl. No.: 11/227,352

(22) Filed: Sep. 15, 2005

(65) Prior Publication Data

US 2006/0267707 A1 Nov. 30, 2006

(30) Foreign Application Priority Data

May 31, 2005 (TW) .............................. 94117855 A

(51) Int. Cl.
*H01P 5/12* (2006.01)
*H03H 7/38* (2006.01)

(52) U.S. Cl. ........................ 333/126; 333/129; 333/134

(58) Field of Classification Search ................. 333/126, 333/129, 132, 134, 17.3, 33; 455/132, 552.1; 343/860

See application file for complete search history.

(56) References Cited

U.S. PATENT DOCUMENTS 4,586,007 A * 4/1986 Ciszek ....................... 333/175
5,432,487 A * 7/1995 Dydyk ....................... 333/161
5,604,470 A * 2/1997 Atokawa .................... 333/126
6,249,687 B1 * 6/2001 Thomsen et al. ......... 455/553.1
6,411,178 B1 6/2002 Matsumura et al. ......... 333/134
6,414,567 B2 7/2002 Matsumura et al. ......... 333/134
6,538,528 B2 * 3/2003 Louzir et al. ................ 333/128
6,639,491 B2 * 10/2003 Toncich ...................... 333/125
6,707,350 B1 3/2004 Rosenbaum ................ 333/126
7,003,312 B2 * 2/2006 Kemmochi et al. ...... 455/552.1
7,126,440 B2 * 10/2006 Bradley et al. .............. 333/133

FOREIGN PATENT DOCUMENTS

WO WO 0148935 * 7/2001

* cited by examiner

*Primary Examiner*—Robert J. Pascal
*Assistant Examiner*—Kimberly E Glenn

(57) ABSTRACT

A multilayer chip-type triplexer is provided. It uses four-session matching transmission lines to integrate three band-pass filters at different frequency bands for simplifying triplexer design. A band-pass filter may be composed of a two-stage combline band-pass filter. The transmission zero generated by the two-stage combline band-pass filter is to increase the isolation and performance of the triplexer. The triplexer uses low-loss materials to reduce the insertion loss of the circuit Moreover, a multilayer structure is adopted to minimize the size of the triplexer. The triplexer is applicable to multiband radio-frequency modules, and meets the multi-module requirement for wireless communication products.

10 Claims, 8 Drawing Sheets

MULTILAYER CHIP-TYPE TRIPLEXER

FIELD OF THE INVENTION

The present invention generally relates to a triplexer, and especially to a multilayer chip-type triplexer.

BACKGROUND OF THE INVENTION

With the advance of wireless communication technology, plenty of convenient wireless communication systems have been developed. These systems include global system for mobile communication (GSM), personal communication service (PCS), and wireless local area network (WLAN), etc. The radio-frequency (RF) modules adopted in conventional single-band systems are not sufficient for current wireless communication systems that essentially emphasize multiple functions. The multi-band or even multi-mode modules have become the future trend of the RF modules.

The structures of a matching circuit (e.g., inductors or transmission lines) associated with filters of different frequency bands are similar to the duplexer designs disclosed in U.S. Pat. Nos. 6,707,350, 6,414,567, and 6,411,178. In U.S. Pat. No. 6,707,350, the band-pass filter of a duplexer uses a direct input structure. The band-pass filter structure of a duplexer disclosed in U.S. Pat. No. 6,414,567 consists of three resonator These resonators are coupled through capacitive coupling, and inductors are used for the design of the matching circuit. In another U.S. Pat. No. 6,411,178, the band-pass filter structure of a disclosed duplexer comprises three resonators, and its matching circuit adopts a serial combination of capacitors and inductors.

The major function of a triplexer is to separate a received signal into different frequency bands with good isolation. Conventional triplexers are designed with low-pass and high-pass filters or plural band-pass filters. The former design has the advantage of low insertion loss and good isolation but its drawback is a large distortion outside the allowed frequency band. The latter design has the advantage of good selectivity among various frequency bands but its design is quite complicated. The complexity of the design results from a requirement of many stages for band-pass filters. Furthermore, it has a high insertion loss.

SUMMARY OF THE INVENTION

The present invention has been made to overcome the drawback of high design complexity for the aforementioned conventional triplexers which contain plural band-pass filters. It provides a chip-type triplexer capable of reducing the design complexity.

The triplexer of the present invention is designed to locate the center frequencies of three different frequency bands to 900 MHz, 1800 MHz, and 2400 MHz. In order to improve signal isolation and impedance matching, the first band-pass filter in 900 MHz frequency band is designed to allow transmission zero at a frequency of 2000 MHz. The second band-pass filter in 1800 MHz frequency band is designed to allow transmission zero at a frequency of 2400 MHz. The third band-pass filter in 2400 MHz frequency band is designed to allow transmission zero at a frequency between 1800 MHz and 1900 MHz.

The three band-pass filters of the present invention are designed separately, and then the second band-pass filter and the third band-pass filter are combined into a duplexer through a matching circuit Finally, the first band-pass filter is incorporated into the duplexer through another matching circuit to form a triplexer. The matching circuit can be implemented with matching transmission lines.

According to the chip-type triplexer of the present invention, four matching transmission lines are used to integrate three two-stage combline-type band-pass filters located at different bands. The three band-pass filters can be three standalone two-stage combline-type band-pass filters. The two-stage combline-type band-pass filters have low insertion loss. In addition, they can produce transmission zeros at low pass-band skirt and at high pass-band skirt respectively, through controlling the coupling coefficients (e.g., electric coupling or magnetic coupling) of the transmission lines. A J-inverter between the two resonators of the two-stage combline-type band-pass filter can become an equivalent of a $\pi$-type capacitor or inductor. Therefore, it behaves like an inductive coupling when used with a low-frequency combline-type band-pass filter or a capacitive coupling when used with a high-frequency combline-type band-pass filter.

The first band-pass filter and the second band-pass filter each adopts a two-stage combline-type band-pass filter which is capable of producing transmission zero at high passband skirt. The third band-pass filter adopts a two-stage combline-type band-pass filter which is capable of producing transmission zero at low passband skirt.

Every matching transmission line has two terminals, the first terminal and the second terminal. The first band-pass filter is electrically connected to the second terminal of the first matching transmission line. The second band-pass filter is electrically connected to the second terminal of the second matching transmission line. The third band-pass filter is electrically connected to the second terminal of the third matching transmission line. The first terminal of the third matching transmission line, the first terminal of the second transmission line, and the first terminal of the fourth transmission line are electrically connected together. The first terminal of the first transmission line and the second terminal of the fourth transmission line are electrically connected to the input port of the antenna.

The adoption of capacitive coupling at the input port of a combline-type band-pass filter can improve the insertion loss at low frequencies. However, there is a side effect of introducing extra loss at other frequencies. Therefore, the second band-pass filter must be isolated from the third band-pass filter when they are designed. To enhance the isolation between the second band-pass filter and the first band-pass filter, a capacitive coupling is adopted for the second band-pass filter. A direct input method is chosen for the third band-pass filter. Moreover, there are two input capacitors disposed in the second band-pass filter.

The chip-type triplexer of the present invention has a multilayer structure. The multilayer structure consists of seventeen layers, a first layer to a seventeenth layer from top to bottom. Each layer comprises a primary surface plane.

Four matching transmission lines and thirty-one metallic sheets are formed on the primary surface planes of the seventeen-layer structure. The multilayer chip-type triplexer is obtained by connecting nineteen metallic sheets to the matching transmission metallic lines and sheets on each layer through via-holes.

An electromagnetic simulation indicates that the multilayer chip-type triplexer of the present invention has very good isolation and selectivity.

In summary, the band-pass filters of the present invention at various frequencies bands are first designed independently, and then matching circuit is applied to integrate these band-pass filters. The complexity of circuit design is hence reduced. The matching circuit uses a structure of matching transmission line to simplify the design flow and reduce the design time. Moreover, the triplexer of the present invention consists of a multilayer circuit structure and its matching transmission lines surround multiple substrate layers. Therefore, the area of the circuit layout is greatly reduced to meet the requirement of small form factor for future wireless communication products.

The foregoing and other objects, features, aspects and advantages of the present invention will become better understood from a careful reading of a detailed description provided herein below with appropriate reference to the accompanying drawings.

DETAILED DESCRIPTION OF THE PREFERRED EMBODIMENTS

Figure 1:
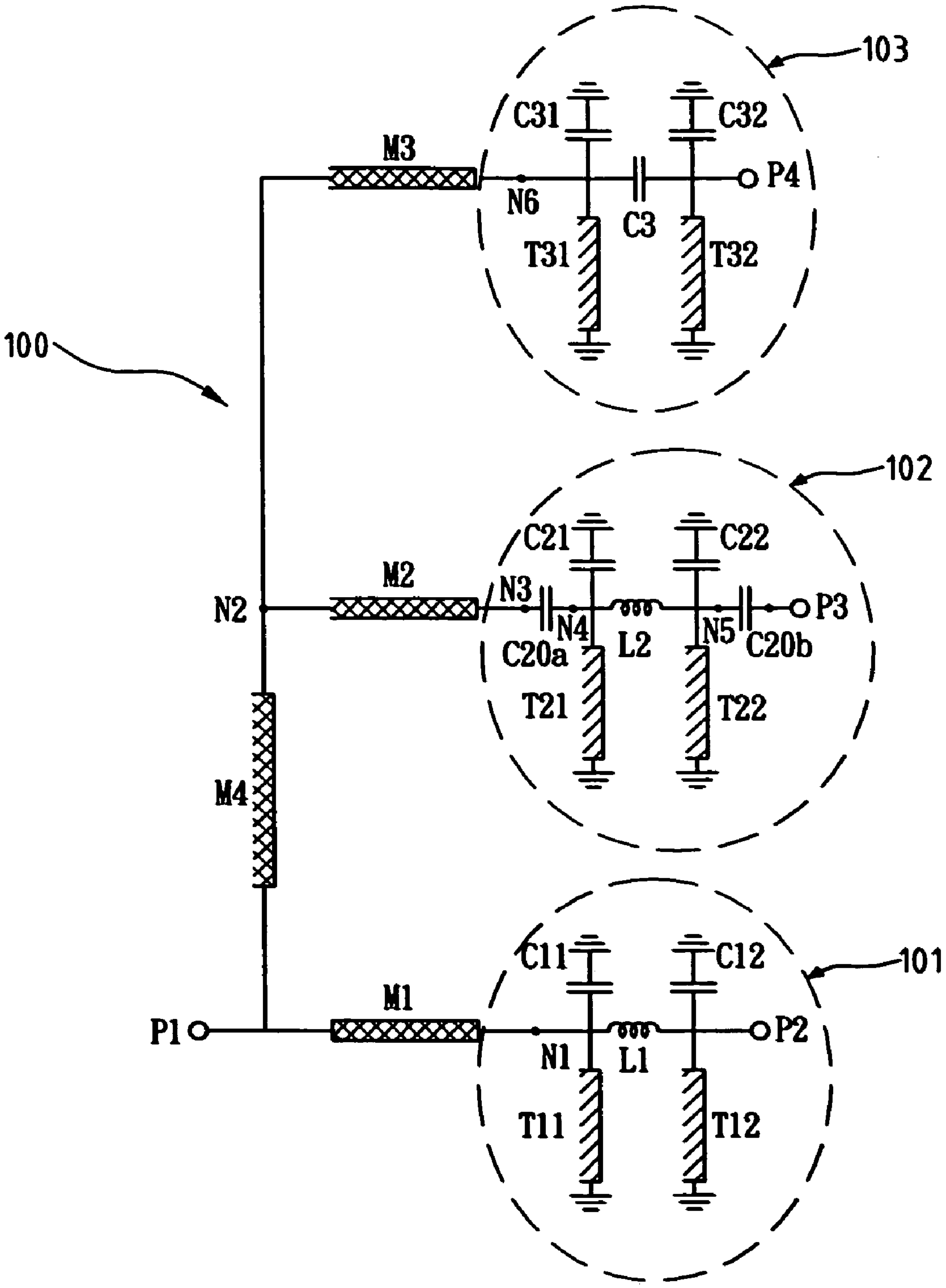
FIG. 1 shows the equivalent circuit of an embodiment of the present invention.
Figure 2:
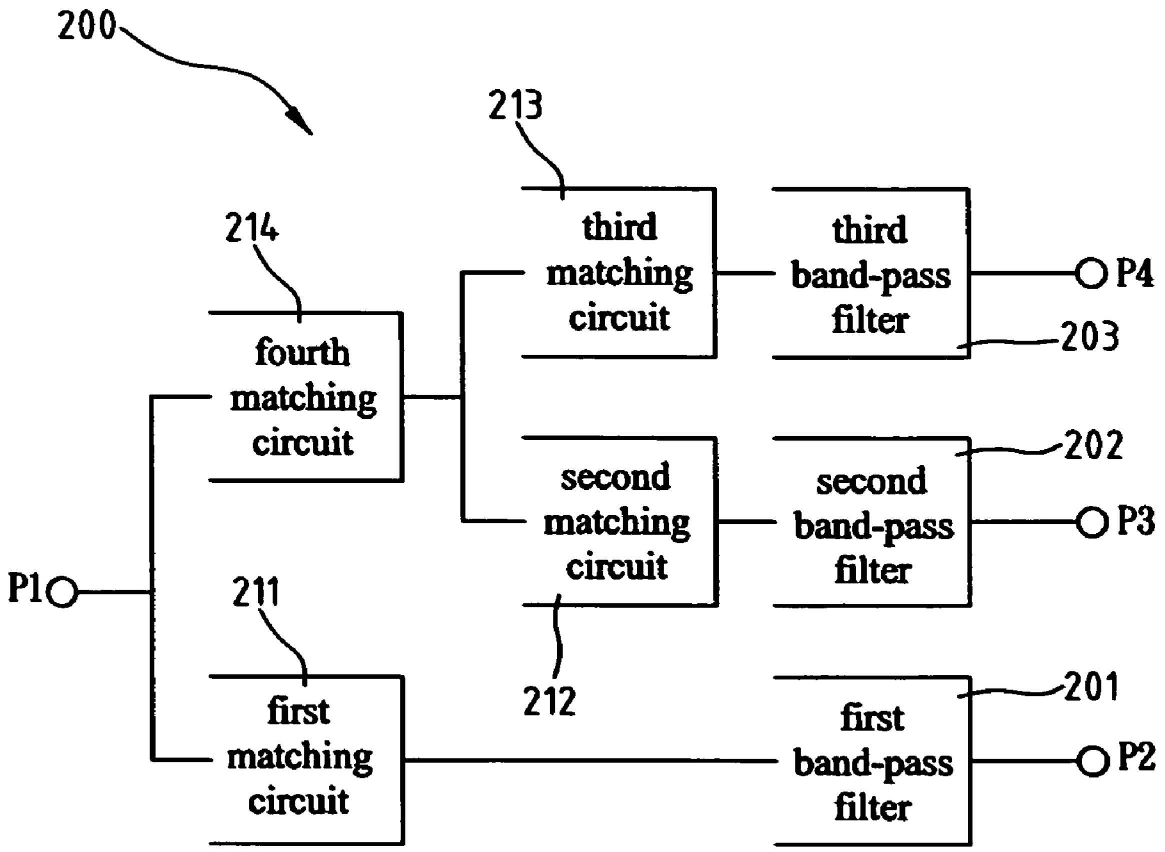
FIG. 2 shows the block diagram of an embodiment of the present invention.

FIG. 1 shows the equivalent circuit of an embodiment of the multilayer chip-type triplexer according to the present invention. FIG. 2 depicts the block diagram of the embodiment shown in FIG. 1. As can be seen from FIG. 2, the three band-pass filters 201-203 can be first designed independently, and then the second matching circuit 212 and the third matching circuit 213 are applied to integrate the second band-pass filter 202 and the third band-pass filter 203 into a duplexer. The duplexer is further integrated with the fourth matching circuit 214 and the first matching circuit 211 to form a triplexer 200.

Referring to FIG. 1 again, every matching transmission line has two terminals, the first terminal and the second terminal. The second terminal of the third matching transmission line M3 is electrically connected with the third band-pass filter 103 through the sixth node N6. The second terminal of the second matching transmission line M2 is electrically connected with the second band-pass filter 102 through the third node N3. The second terminal of the first matching transmission line M1 is electrically connected with the first band-pass filter 101 through the first node N1. The first terminal of the third matching transmission line M3, the first terminal of the second matching transmission line M2, and the first terminal of the fourth matching transmission line M4 are electrically connected together through the second node N2. The first terminal of the first transmission line M1 and the second terminal of the fourth transmission line M4 are electrically connected to the input port P1 of the antenna.

Figure 3:
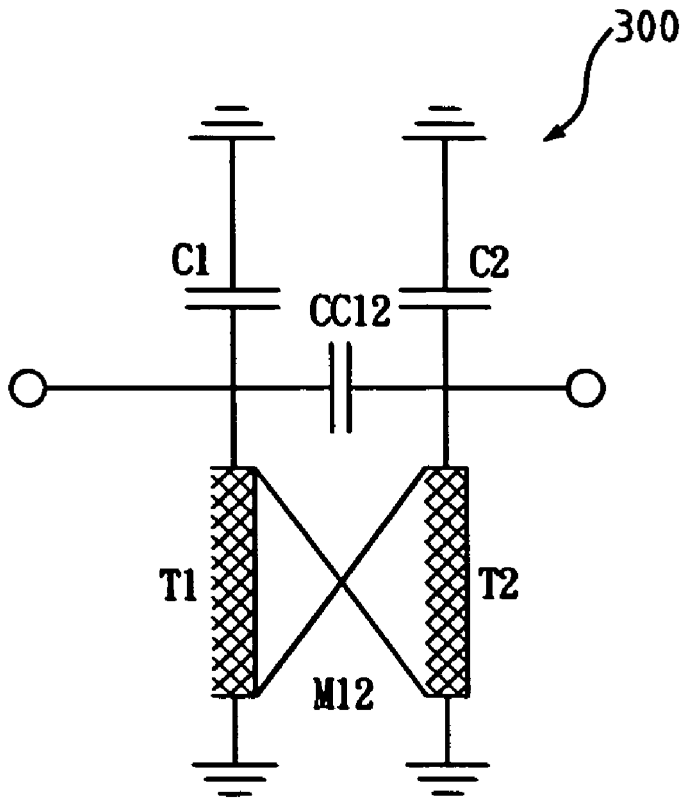
FIG. 3 shows the equivalent circuit of two-stage combline-type band-pass filter adopted in an embodiment of the present invention.
Figure 4A:
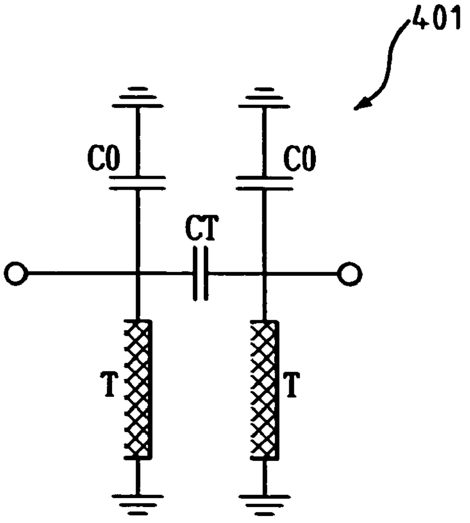
FIG. 4A depicts an equivalent circuit of the band-pass filter shown in FIG. 3, in which a transmission zero at low pass-band skirt is produced through controlling the coupling coefficients of the transmission lines.
Figure 4B:
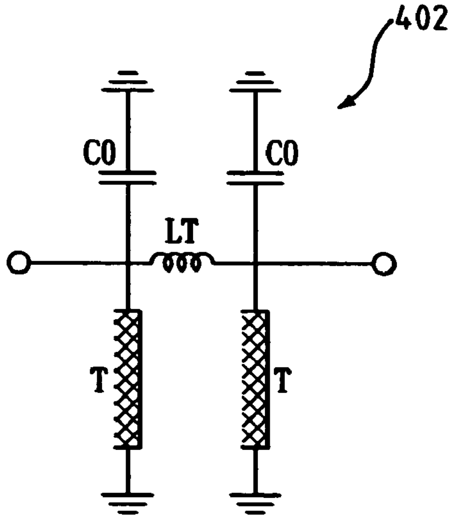
FIG. 4B depicts another equivalent circuit of the band-pass filter shown in FIG. 3, in which a transmission zero at high pass-band skirt is produced through controlling the coupling coefficients of the transmission lines.

The two-stage combline-type band-pass filter 300 shown in FIG. 3 has low insertion loss. Through controlling the coupling coefficients (e.g., electric coupling or magnetic coupling) of the transmission lines, it can produce transmission zero at low pass-band skirt as the two-stage combline-type band-pass filter 401 shown in FIG. 4A, and at high pass-band skirt as the two-stage combline-type band-pass filter 402 shown in FIG. 4B, respectively. The first band-pass filter 101 and the second band-pass filter 102 each uses a two-stage combline band-pass filter 402. The third band-pass filter 103 uses a two-stage combline band-pass filter 401.

The first band-pass filter 101 has two identical resonators which are connected in parallel. The first resonator is formed by connecting a transmission line T11 and a capacitor C11 in parallel, and the second resonator is formed by connecting a transmission line T12 and a capacitor C12 in parallel. One terminal of each resonator is grounded, and the other terminal is electrically connected to each other through a coupling inductor L1. The second band-pass filter 102 also has two identical resonators which are connected in parallel. The first resonator is formed by connecting a transmission line T21 and a capacitor C21 in parallel, and the second resonator is formed by connecting a transmission line T22 and a capacitor C22 in parallel. One terminal of each resonator is grounded, and the other terminal is electrically connected to each other through a coupling inductor L2. The third band-pass filter 103 has two identical resonators which are connected in parallel. The first resonator is formed by connecting a transmission line T31 and a capacitor C31 in parallel, and the second resonator is formed by connecting a transmission line T32 and a capacitor C32 in parallel. One terminal of each resonator is grounded, and the other terminal is electrically connected to each other through a coupling capacitor C3. inductor L2. The third band-pass filter 103 has two identical resonators which are connected in parallel. The first resonator is formed by connecting a transmission line T31 and a capacitor C31 in parallel, and the second resonator is formed by connecting a transmission line T32 and a capacitor C32 in parallel. One terminal of each resonator is grounded, and the other terminal is electrically connected each other through a coupling capacitor C3.

Referring to the combline band-pass filter of the triplexer 100 shown FIG. 1, an input method using capacitive coupling is adopted in the design of the second band-pass filter. Two identical input capacitors C20*a* and C20*b* are disposed between nodes N3 and N4 and between node N5 and output port P3 of the second band-pass filter. The first band-pass filter 101 and the third band-pass filter 103 use a direct input method.

Figure 5:
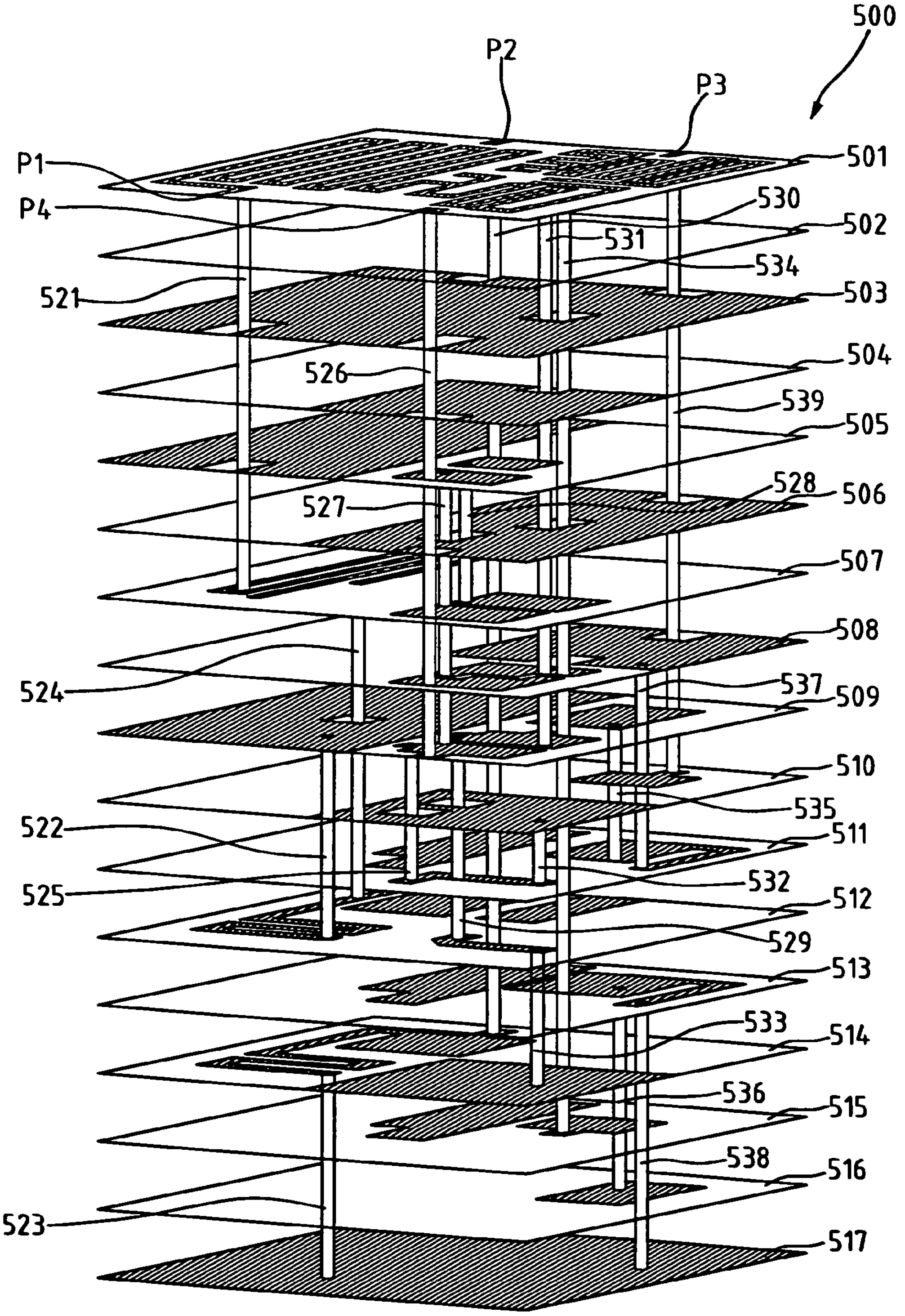
FIG. 5 shows a perspective view of the multiplayer structure of an embodiment of the present invention.
Figure 6:
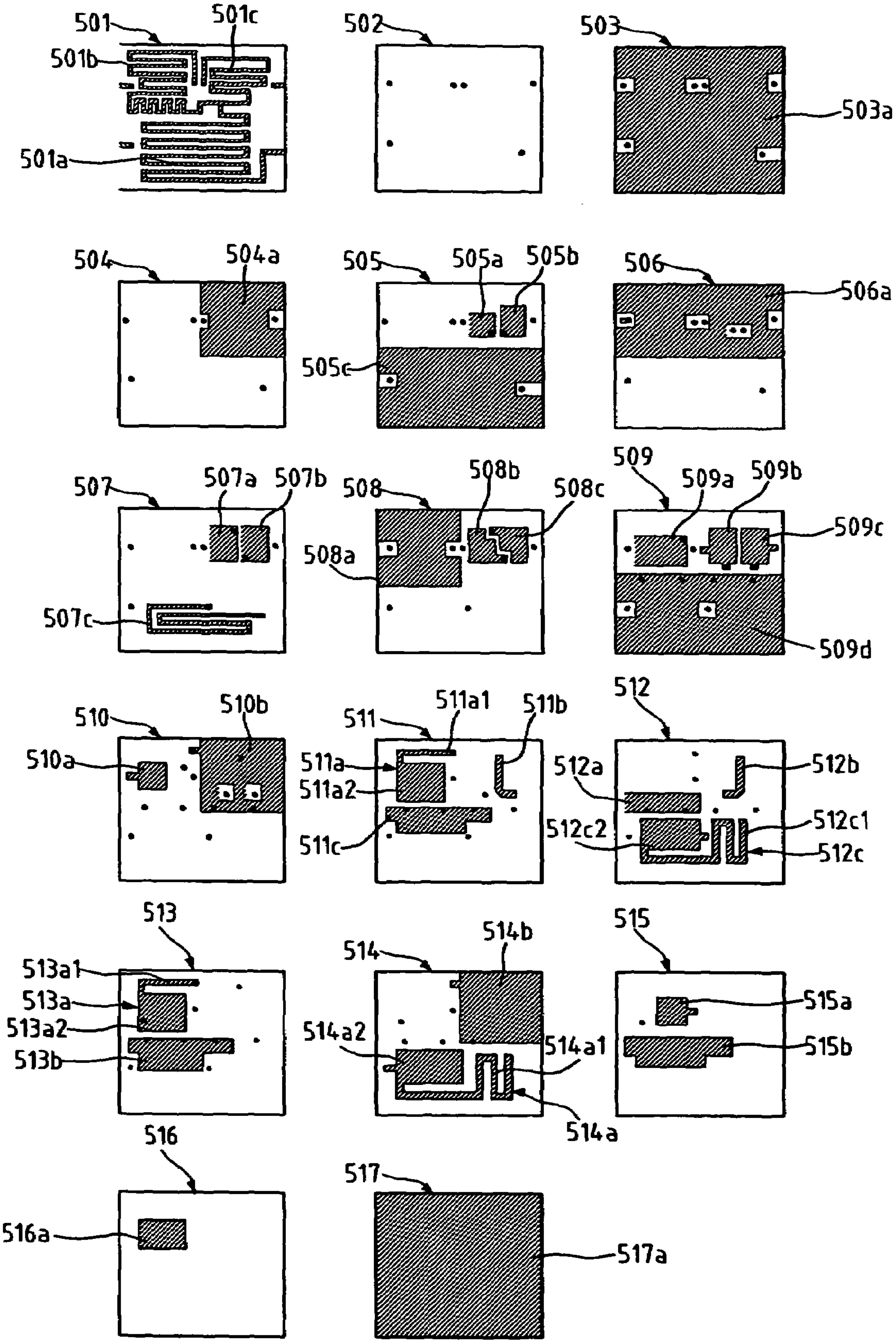
FIG. 6 shows the layout structure of each circuit layer of an embodiment of the present invention.

FIG. 5 shows a perspective view of the multiplayer structure of an embodiment of the present invention. FIG. 6 shows the layout structure of each circuit layer of an embodiment of the present invention. Every black dot shown in each layout pattern in FIG. 6 represents a connecting via going from top surface to bottom surface.

Referring to FIG.5, the multilayer chip-type triplexer 500 has a plural-layer structure. From top to bottom, these layers are a first layer 501, a second layer 502, a third layer 503, a fourth layer 504, a fifth layer 505, a sixth layer 506, a seventh layer 507, an eighth layer 508, a ninth layer 509, a tenth layer 510, an eleventh layer 511, a twelfth layer 512, a thirteenth layer 513, a fourteenth layer 514, a fifteenth layer 515, a sixteenth layer 515, and a seventeenth layer 517. Each layer contains a primary surface plane.

The primary surface plane of the first layer 501 comprises an antenna input port P1, an output port P2 of a first band-pass filter, an output port P3 of a second band-pass filter, an output port P4 of a third band-pass filter, a fourth matching transmission metallic line 501*a*, a second matching transmission metallic line 501*b*, and a third matching transmission metallic line 501*c*.

A first metallic sheet 503*a* is formed on the primary surface plane of the third layer 503.

A second metallic sheet 504*a* is formed on the primary surface plane of the fourth layer 504.

A third metallic sheet 505*a*, a fourth metallic sheet 505*b*, and a fifth metallic sheet 505*c* are formed on the primary surface plane of the fifth layer 505.

A sixth metallic sheet 506*a* is formed on the primary surface plane of the sixth layer 506.

A seventh metallic sheet 507*a*, an eighth metallic sheet 507*b*, and a first matching transmission metallic line 507*c* are formed on the primary surface plane of the seventh layer 507.

A ninth metallic sheet 508*a*, a tenth metallic sheet 508*b*, and an eleventh metallic sheet 508*c* are formed on the primary surface plane of the eighth layer 508.

A twelfth metallic sheet 509*a*, a thirteenth metallic sheet 509*b*, a fourteenth matching transmission metallic line 509*c*, and a fifteenth metallic sheet 509*d* are formed on the primary surface plane of the ninth layer 509.

A sixteenth metallic sheet 510*a* and a seventeenth metallic sheet 510*b* are formed on the primary surface plane of the tenth layer 510.

An eighteenth metallic sheet 511*a*, a nineteenth metallic sheet 511*b*, and a twentieth metallic sheet 511*c* are formed on the primary plane of the eleventh layer 511. The eighteenth metallic sheet comprises a first part 511*a*1 and a second part 511*a*2.

A twenty-first metallic sheet 512*a*, a twenty-second metallic sheet 512*b*, and a twenty-third metallic sheet 512*c* are formed on the primary plane of the twelfth layer 512. The twenty-third metallic sheet comprises a first part 512*c*1 and a second part 512*c*2.

A twenty-fourth metallic sheet 513*a* and a twenty-fifth metallic sheet 513*b* are formed on the primary plane of the thirteenth layer 513. The twenty-fourth metallic sheet comprises a first part 513*a*1 and a second part 513*a*2.

A twenty-sixth metallic sheet 514*a* and a twenty-seventh metallic sheet 514*b* are formed on the primary plane of the fourteenth layer 514. The twenty-sixth metallic sheet comprises a first part 514*a*1 and a second part 514*a*2.

A twenty-eighth metallic sheet 515*a* and a twenty-ninth metallic sheet 515*b* are formed on the primary plane of the fifteenth layer 515.

A thirtieth metallic sheet 516*a* is formed on the primary plane of the sixteenth layer 516.

A thirty-first metallic sheet 517*a* is formed on the primary plane of the seventeenth layer 517.

In order to implement transmission lines which have magnetic coupling effects, ground planes are disposed on thick layers and these ground planes are connected through via-holes The first metallic sheet 503*a*, the second metallic sheet 504*a*, the fifth metallic sheet 505*c*, the sixth metallic sheet 506*a*, the ninth metallic sheet 508*a* the fifteenth metallic sheet 509*d*, the seventeenth metallic sheet 510*b*, the twentieth metallic sheet 511*c*, the twenty-first metallic 512*a*, the twenty-fifth metallic sheet 513*b*, the twenty-ninth metallic sheet 515*b*, and the thirty-first metallic sheet 517*a* are all grounded metallic sheets.

The first terminal of the third matching transmission metallic line 501*c* and the first terminal of the second matching transmission metallic line 501*b* are electrically connected to the first terminal of the fourth matching transmission metallic line 501*a*. The connecting point is the second node N2 shown in FIG. 1.

The first through-hole connecting metallic sheet 521 penetrates the primary surfaces of the first layer 501, the second layer 502, the third layer 503, the fourth layer 504, the fifth layer 505, and the sixth layer 506 to electrically connect the antenna input port P1 with the first terminal of the first matching transmission metallic line 507*c*. The fourth through-hole connecting metallic sheet 524 penetrates the primary surfaces of the seventh layer 507, the eighth layer 508, the ninth layer 509, the tenth layer 510, and the eleventh layer 511 to electrically connect the second terminal of the first matching transmission metallic line 507*c* with the second part 512*c*2 of the twenty-third metallic sheet 512*c*. The connecting point is the first node N1 shown in FIG. 1. The second part 512*c*2 of the twenty-third metallic sheet 512*c*, the fifteenth metallic sheet 509*d*, the twentieth metallic sheet 511*c*, and the twenty-fifth metallic sheet 513*b* form an equivalent capacitor as the C11 shown in FIG. 1. The first part 512*c*1 of the twenty-third metallic sheet 512*c* is the transmission line T11 of the first band-pass filter shown in FIG. 1. The second through-hole connecting metallic sheet 522 penetrates the primary surfaces of the ninth layer 509, the tenth layer 510, and the eleventh layer 511 to electrically connect the fifth metallic sheet 509*d* with the first part 512*c*1 of the twenty-third metallic sheet 512*c*. The connecting point is the ground terminal of the T11 shown in FIG. 1. The second part 514*a*2 of the twenty-sixth metallic sheet 514*a*, the twenty-fifth metallic sheet 513*b*, the twenty-ninth metallic sheet 515*b*, and the thirty-first metallic sheet 517*a* form an equivalent capacitor as the C12 shown in FIG. 1. The first part 514*a*1 of the twenty-sixth metallic sheet 514*a* is the transmission line T12 of the first band-pass filter shown in FIG. 1. The third through-hole connecting metallic sheet 523 penetrates the primary surfaces of the fourteenth layer 514, the fifteenth layer 515, and the sixteenth layer 516 to electrically connect the thirty-first metallic sheet 517*a* with the first part 514*a*1 of the twenty-sixth metallic sheet 514*a*. The connecting point is the ground terminal of the T12 shown in FIG. 1. The first part 512*c*1 of the twenty-third metallic sheet 512*c* and the first part 514*a*1 of the twenty-sixth metallic sheet 514*a* form an inductive coupling effect between top and bottom elements, which results in a coupling inductor L1 of the first band-pass filter shown in FIG. 1. The tenth through-hole connecting metallic sheet 530 penetrates the primary surfaces of the first layer 501, the second layer 502, the third layer 503, the fourth layer 504, the fifth layer 505, the sixth layer 506, the seventh layer 507, the eighth layer 508, the ninth layer 509, the tenth layer 510, the eleventh layer 511, the twelfth layer 512, and the thirteenth layer 513 to electrically connect the second part 514*a*2 of the twenty-sixth metallic sheet 514*a* with the output port P2 of the first band-pass filter.

The fourteenth through-hole connecting metallic sheet 534 penetrates the primary surface of the first layer 501, the second layer 502, the third layer 503, the fourth layer 504, the fifth layer 505, the sixth layer 506, the seventh layer 507, the eighth layer 508, the ninth layer 509, the tenth layer 510, the eleventh layer 511, the twelfth layer 512, the thirteenth layer 513, and the fourteenth layer 514 to electrically connect the second terminal of the second matching transmission metallic line 501*b* with the twenty-eighth metallic sheet 515*a*. The connecting point is the third node N3 shown in FIG. 1. The twenty-eighth metallic sheet 515*a*, the second part 513*a*2 of the twenty-fourth metallic sheet 513*a*, and the thirtieth metallic sheet 516*a* form an equivalent capacitor as the input capacitor C20*a* shown in FIG. 1. The sixteenth through-hole connecting metallic sheet 536 penetrates the primary surfaces of the thirteenth layer 513, the fourteenth layer 514, and the fifteenth layer 515 to electrically connect the thirtieth metallic sheet 516*a* with the second part 513*a*2 of the twenty-fourth metallic sheet 513*a*.

The first part 513*a*1 of the twenty-fourth metallic sheet 513*a* is the transmission line T21 of the second band-pass filter shown in FIG. 1. The eighteenth through-hole connecting metallic sheet 538 penetrates the primary surfaces of the thirteenth layer 513, the fourteenth layer 514, the fifteenth layer 515, and the sixteenth layer 516 to electrically connect the thirty-first metallic sheet 517*a* with the first part 513*a*1 of the twenty-fourth metallic sheet 513*a*. The connecting point is the ground terminal of T21 shown in FIG. 1. The second part 513*a*2 of the twenty-fourth metallic sheet 513*a* and the twenty-first metallic sheet 512*a* form an equivalent capacitor. The thirtieth metallic sheet 516*a* and the thirty-first metallic sheet 517*a* form another equivalent capacitor. These two capacitors define an equivalent capacitor C21, as shown in FIG. 1. The first part 511*a*1 of the eighteenth metallic sheet 511*a* is the transmission line T22 of the second band-pass filter shown in FIG. 1. The seventeenth through-hole connecting metallic sheet 537 penetrates the primary surfaces of the eighth layer 508, the ninth layer 509, and the tenth layer 510 to electrically connect the first part 511*a*1 of the eighteenth metallic sheet 511*a* with the ninth metallic sheet 508*a*. The connecting point is the ground terminal of T22 shown in FIG. 1. The first part 513*a*1 of the twenty-fourth metallic sheet 513*a* and the first part 511*a*1 of the eighteenth metallic sheet 511*a* form an inductive coupling effect between top and bottom elements, which results in a coupling inductor L2 of the first band-pass filter shown in FIG. 1. The second part 511*a*2 of the eighteenth metallic sheet 511*a* and the twenty-first metallic sheet 512*a* form an equivalent capacitor. The twelfth metallic sheet 509*a* and the ninth metallic sheet 508*a* form another equivalent capacitor. These two capacitors define an equivalent capacitor C22, as shown in FIG. 1. The fifteenth through-hole connecting metallic sheet 535 penetrates the primary surfaces of the ninth layer 509 and the tenth layer 510 to electrically connect the second part 511*a*2 of the eighteenth metallic sheet 511*a* with the first part 509*a*1 of the twelfth metallic sheet 509*a*. The sixteenth metallic sheet 510*a*, the twelfth metallic sheet 509*a*, and the second part 511*a*2 of the eighteenth metallic sheet 511*a* form an equivalent capacitor as the first input capacitor C20*b* shown in FIG. 1. The nineteenth through-hole connecting metallic sheet 539 penetrates the primary surfaces of the first layer 501, the second layer 502, the third layer 503, the fourth layer 504, the fifth layer 505, the sixth layer 506, the seventh layer 507, the eighth layer 508, and the ninth layer 509 to electrically connect the seventeenth metallic sheet 510*b* with the output port P3 of the second band-pass filter.

The eleventh through-hole connecting metallic sheet 531 penetrates the primary surfaces of the first layer 501, the second layer 502, the third layer 503, the fourth layer 504, the fifth layer 505, the sixth layer 506, the seventh layer 507, and the eighth layer 508 to electrically connect the second terminal of the third matching transmission metallic line 510*c* with the thirteenth metallic sheet 509*b*. The connecting point is the sixth node N6 shown in FIG. 1. The twenty-second metallic sheet 512*b* is the transmission line T31 of the third band-pass filter shown in FIG. 1. The ninth through-hole connecting metallic sheet 529 penetrates the primary surfaces of the ninth layer 509, the tenth layer 510, and the eleventh layer 511 to electrically connect the thirteenth metallic sheet 509*b* with the twenty-second metallic sheet 512*b*. The thirteenth through-hole connecting metallic sheet 533 penetrates the primary surfaces of the twelfth layer 512 and the thirteenth layer 513 to electrically connect the twenty-second metallic sheet 512*b* with the twenty-seventh metallic sheet 514*b*. The thirteenth metallic sheet 509*b*, the seventeenth metallic sheet 510*b*, the seventh metallic sheet 507*a*, the sixth metallic sheet 506*a*, the third metallic sheet 505*a*, the second metallic sheet 504*a*, and the sixth metallic sheet 506*a* form an equivalent capacitor which is the capacitor C31 of the third band-pass filter shown in FIG. 1. The eighth metallic sheet 511*b* is the transmission line T32 of the third band-pass filter shown in FIG. 1. The tenth metallic sheet 508*b*, the seventh metallic sheet 507*a*, and the thirteenth metallic sheet 509*b* form an equivalent capacitor. The fourteenth metallic sheet 508*c*, the eighth metallic sheet 507*b*, and the fourteenth metallic sheet 509*c* form another equivalent capacitor. These two capacitors define an equivalent coupling capacitor C3 of the third band pass filter, as shown in FIG. 1. The seventh through-hole connecting metallic sheet 527 penetrates the primary surfaces of the fifth layer 505, the sixth layer 506, the seventh layer 507, and the eighth layer 508 to electrically connect the fourteenth metallic sheet 509*c* with the fourth metallic sheet 505*b*. The fourteenth metallic sheet 509*c*, the seventeenth metallic sheet 510*b*, the eighth metallic sheet 507*b*, the sixth metallic sheet 506*a*, the fourth metallic sheet 505*b*, the second metallic sheet 504*a*, and the sixth metallic sheet 506*a* form an equivalent capacitor which is the capacitor C32 of the third band-pass filter shown in FIG. 1. The eighth through-hole connecting metallic sheet 528 penetrates the primary surfaces of the fifth layer 505 and the sixth layer 506 to electrically connect the third metallic sheet 505*a* with the seventh metallic sheet 507*a*. The fifth through-hole connecting metallic sheet 525 penetrates the primary surfaces of the ninth layer 509 and the tenth layer 510 to electrically connect the fourteenth metallic sheet 509*c* with the nineteenth metallic sheet 511*b*. The twelfth through-hole connecting metallic sheet 532 penetrates the primary surface of the tenth layer 510 to electrically connect the nineteenth metallic sheet 511*b* with the seventeenth metallic sheet 510*b*. The sixth through-hole connecting metallic sheet 526 penetrates the primary surfaces of the first layer 501, the second layer 502, the third layer 503, the fourth layer 504, the fifth layer 505, the sixth layer 506, the seventh layer 507, and the eighth layer 508 to electrically connect the fourteenth metallic sheet 509*c* with the output port P4 of the third band-pass filter.

Figure 7A:
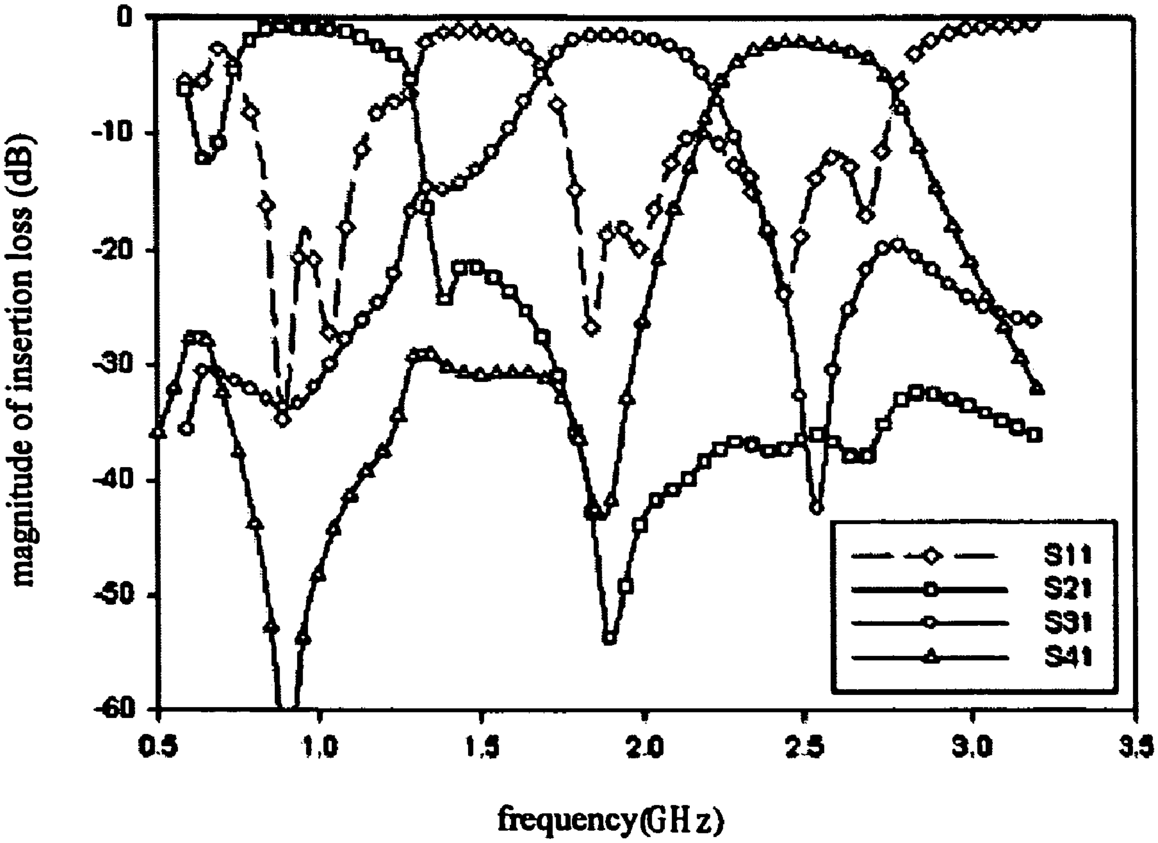
FIG. 7 shows an electromagnetic simulation result of an embodiment of the present invention.
Figure 7B:
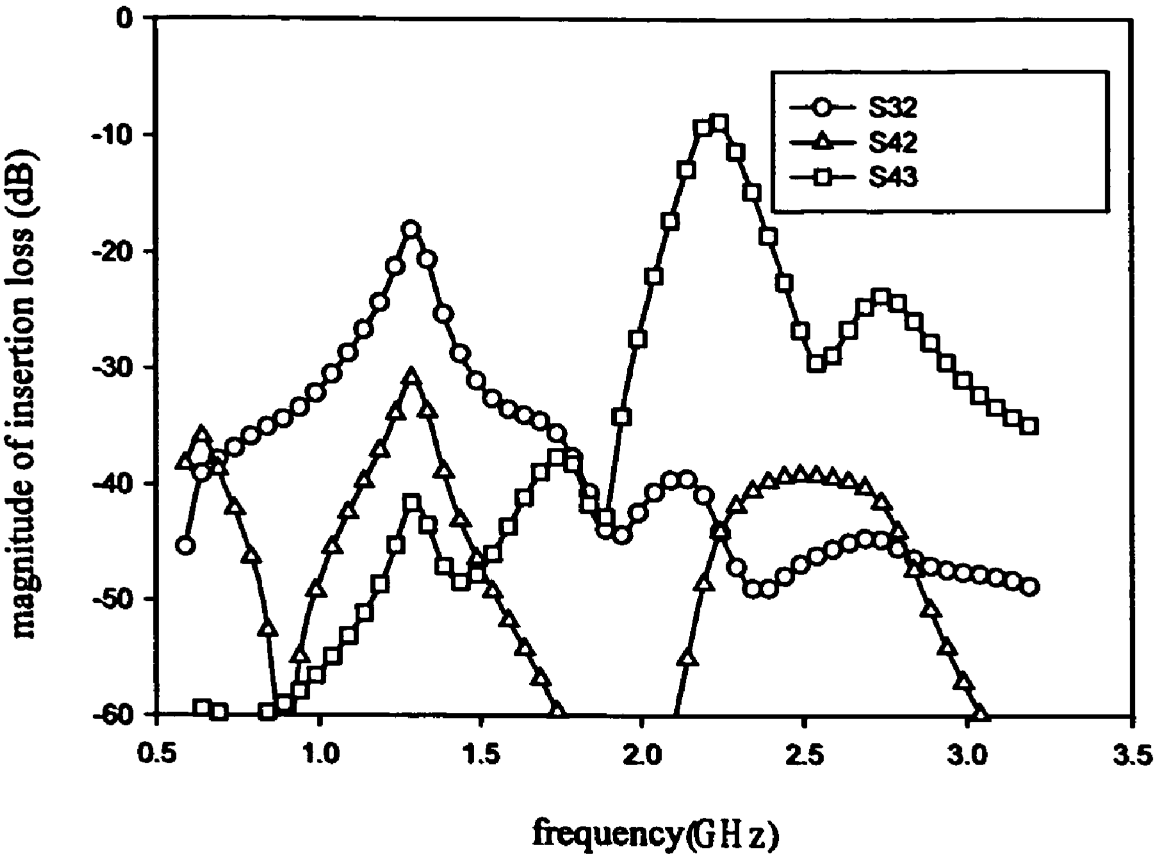

FIG. 7 shows an electromagnetic simulation result of an embodiment of the present invention. As shown in FIG. 7A for three different frequency bands, the insertion loss is smaller than 2.5 dB and the reflection loss is greater than 15 dB. The first band-pass filter at 900 MHz has a transmission zero at 2000 MHz. The second band-pass filter at 1800 MHz has a transmission zero at 2400 MHz. The third band-pass filter at 2400 MHz has a transmission zero between 1800 MHz and 1900 MHz. This means that the isolation is good among different frequency bands. FIG. 7B also shows that the isolation is greater than 20 dB among different frequency bands. The above results can be applied to the design of multimode RF modules.

In summary, the multilayer chip-type triplexer of the present invention provides the advantage of integrating multiple frequency bands. It can be widely applied in the industry.

Although the present invention has been described with reference to the embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A multilayer chip-type triplexer, comprising:

an antenna input port;

four matching transmission lines including first, second, third and fourth matching transmission lines for providing electrical or magnetic coupling through control of coupling coefficients of the transmission lines, each of the matching transmission lines having first and second terminals; and three band-pass filters at different frequencies including first, second and third band-pass filters each having an input port and an output port;

wherein the input port of the first band-pass filter is electrically connected with the second terminal of the first matching transmission line, the input port of the second band-pass filter is electrically connected with the second terminal of the second matching transmission line, the input port of the third band-pass filter is electrically connected with the second terminal of the third matching transmission line, the first terminal of the third matching transmission line, the first terminal of the second matching transmission line, and the first terminal of the fourth matching transmission line are electrically connected together, and the first terminal of the first matching transmission line and the second terminal of the fourth matching transmission line are electrically connected with said antenna input port.

2. The multilayer chip-type triplexer as claimed in claim 1, wherein said first band-pass filter, said second band-pass filter, and said third band-pass filter are all two-stage combline band-pass filters.

3. The multilayer chip-type triplexer as claimed in claim 2, wherein said first band-pass filter comprises two identical resonators each being formed by a transmission line and a capacitor connected in parallel, each of said two resonators has one grounded terminal and one ungrounded terminal, and the two ungrounded terminals of said two resonators of said first band-pass filter are electrically connected together through an inductor.

4. The multilayer chip-type triplexer as claimed in claim 2, wherein said second band-pass filter comprises two identical resonators each being formed by a transmission line and a capacitor connected in parallel, each of said two resonators has one grounded terminal and one ungrounded terminal, and the two ungrounded terminals of said two resonators of said second band-pass filter are electrically connected together through an inductor.

5. The multilayer chip-type triplexer as claimed in claim 4, wherein said second band-pass filter comprises first and second input capacitors, said input port of said second band-pass filter is electrically connected to one of the two ungrounded terminals through said first input capacitor, and said output port of said second band-pass filter is electrically connected to the other of the two ungrounded terminals through said second input capacitor.

6. The multilayer chip-type triplexer as claimed in claim 2, wherein said third band-pass filter comprises two identical resonators each being formed by a transmission line and a capacitor connected in parallel, each of said two resonators has one grounded terminal and one ungrounded terminal, and the two ungrounded terminals of said two resonators of said third band-pass filter are electrically connected together through an inductor.

7. The multilayer chip-type triplexer as claimed in claim 1, wherein said multilayer chip-type triplexer has a plural-layer structure.

8. The multilayer chip-type triplexer as claimed in claim 1, wherein the central frequencies of said first band-pass filter, said second band-pass filter, and said third band-pass filter are located at 900 MHz, 1800 MHz, and 2400 MHz, respectively.

9. A multilayer chip-type triplexer, comprising:

an antenna input port;

four matching transmission lines including first, second, third and fourth matching transmission lines each having first and second terminals; and three band-pass filters at different frequencies including first, second and third band-pass filters each having an input port and an output port;

wherein the input port of the first band-pass filter is electrically connected with the second terminal of the first matching transmission line, the input port of the second band-pass filter is electrically connected with the second terminal of the second matching transmission line, the input port of the third band-pass filter is electrically connected with the second terminal of the third matching transmission line, the first terminal of the third matching transmission line, the first terminal of the second matching transmission line, and the first terminal of the fourth matching transmission line are electrically connected together, and the first terminal of the first matching transmission line and the second terminal of the fourth matching transmission line are electrically connected with said antenna input port; and wherein said multilayer chip-type triplexer has a plural-layer structure comprising from top to bottom:

a first layer having a primary surface plane formed with said antenna input port, the three output ports of said three band-pass filters, and said second, third and fourth matching transmission lines;

a second layer having a primary surface plane;

a third layer having a primary surface plane formed with a first metallic sheet;

a fourth layer having a primary surface plane formed with a second metallic sheet;

a fifth layer having a primary surface plane formed with third, fourth and fifth metallic sheets;

a sixth layer having a primary surface plane formed with a sixth metallic sheet;

a seventh layer having a primary surface plane formed with a seventh metallic sheet, an eighth metallic sheet, and said first matching transmission line;

an eighth layer having a primary surface plane formed with ninth, tenth and eleventh metallic sheets;

a ninth layer having a primary surface plane formed with twelfth, thirteenth, fourteenth and fifteenth metallic sheets;

a tenth layer having a primary surface plane formed with sixteenth and seventeenth metallic sheets;

an eleventh layer having a primary surface plane formed with eighteenth, nineteenth, and twentieth metallic sheets, said eighteenth metallic sheet having first and second parts;

a twelfth layer having a primary surface plane formed with twenty-first, twenty-second and twenty-third metallic sheets, said twenty-third metallic sheet having first and second parts;

a thirteenth layer having a primary surface plane formed with twenty-fourth and twenty-fifth metallic sheets, said twenty-fourth metallic sheet having first and second parts;

a fourteenth layer having a primary surface plane formed with twenty-sixth and twenty-seventh metallic sheets, said twenty-sixth metallic sheet having first and second parts;

a fifteenth layer having a primary surface plane formed with twenty-eighth and twenty-ninth metallic sheets;

a sixteenth layer having a primary surface plane formed with a thirtieth metallic sheet; and a seventeenth layer having a primary surface plane formed with a thirty-first metallic sheet;

wherein the second terminal of the first matching transmission line is electrically connected with the second part of said twenty-third metallic sheet, the first part of said twenty-third metallic sheet is electrically connected with said fifteenth metallic sheet, the first part of said twenty-sixth metallic sheet is electrically connected with said thirty-first metallic sheet, the second part of said twenty-sixth metallic sheet is electrically connected with the output port of said first band-pass filter, the second terminal of said second matching transmission line is electrically connected with said twenty-eighth metallic sheet, said thirtieth metallic sheet is electrically connected with the second part of said twenty-fourth metallic sheet, the first part of said twenty-fourth metallic sheet is electrically connected with said thirty-first metallic sheet, the first part of said eighteenth metallic sheet is electrically connected with said ninth metallic sheet, the second part of said eighteenth metallic sheet is electrically connected with said twelfth metallic sheet, said seventeenth metallic sheet is electrically connected with the output port of said second band-pass filter, the second terminal of said third matching transmission line is electrically connected with said thirteenth metallic sheet, said thirteenth metallic sheet is electrically connected with said twenty-second metallic sheet, said twenty-second metallic sheet is electrically connected with said twenty-seventh metallic sheet, said fourteenth metallic sheet is electrically connected with said fourth metallic sheet, said third metallic sheet is electrically connected with said seventh metallic sheet, said fourteenth metallic sheet is electrically connected with said nineteenth metallic sheet, said nineteenth metallic sheet is electrically connected with said seventeenth metallic sheet, said fourteenth metallic sheet is electrically connected with the output port of said third band-pass filter, and said first metallic sheet, said second metallic sheet, said fifth metallic sheet, said sixth metallic sheet, said ninth metallic sheet, said fifteenth metallic sheet, said seventeenth metallic sheet, said twentieth metallic sheet, said twenty-first metallic sheet, said twenty-fifth metallic sheet, said twenty-ninth metallic sheet, and said thirty-first metallic sheet are electrically connected to the ground.

10. The multilayer chip-type triplexer as claimed in claim 8, wherein said multilayer chip-type triplexer further comprises a first through-hole connecting metallic sheet that penetrates the primary surfaces of said first layer, said second layer, said third layer, said fourth layer, said fifth layer, and said sixth layer to electrically connect said antenna input port with the first terminal of the first matching transmission line, a fourth through-hole connecting metallic sheet that penetrates the primary surfaces of said seventh layer, said eighth layer, said ninth layer, said tenth layer, and said eleventh layer to electrically connect the second terminal of the first matching transmission line with said twenty-third metallic sheet, a second through-hole connecting metallic sheet that penetrates the primary surfaces of said ninth layer, said tenth layer, and said eleventh layer to electrically connect the first part of said twenty-third metallic sheet with said fifteenth metallic sheet, a third through-hole connecting metallic sheet that penetrates the primary surfaces of said fourteenth layer, said fifteenth layer, and said sixteenth layer to electrically connect the first part of said twenty-sixth metallic sheet with said thirty-first metallic sheet, a tenth through-hole connecting metallic sheet that penetrates the primary surfaces of said first layer, said second layer, said third layer, said fourth layer, said fifth layer, said sixth layer, said seventh layer, said eighth layer, said ninth layer, said tenth layer, said eleventh layer, said twelfth layer, and said thirteenth layer to electrically connect the second part of said twenty-sixth metallic sheet with the output port of said first band-pass filter, a fourteenth through-hole connecting metallic sheet that penetrates the primary surfaces of said first layer, said second layer, said third layer, said fourth layer, said fifth layer, said sixth layer, said seventh layer, said eighth layer, said ninth layer, said tenth layer, said eleventh layer, said twelfth layer, said thirteenth layer, and said fourteenth layer to electrically connect the second terminal of the second matching transmission line with said twenty-eighth metallic sheet, a sixteenth through-hole connecting metallic sheet that penetrates the primary surfaces of said thirteenth layer, said fourteenth layer, and said fifteenth layer to electrically connect said thirtieth metallic sheet with the second part of said twenty-fourth metallic sheet, an eighteenth through-hole connecting metallic sheet that penetrates the primary surfaces of said thirteenth layer, said fourteenth layer, said fifteenth layer, and said sixteenth layer to electrically connect said thirty-first metallic sheet with the first part of said twenty-fourth metallic sheet, a seventeenth through-hole connecting metallic sheet that penetrates the primary surfaces of said eighth layer, said ninth layer, and said tenth layer to electrically connect the first part of said eighteenth metallic sheet with said ninth metallic sheet, a fifteenth through-hole connecting metallic sheet that penetrates the primary surfaces of said ninth layer and said tenth layer to electrically connect the second part of said eighteenth metallic sheet with the first part of said twelfth metallic sheet, a nineteenth through-hole connecting metallic sheet that penetrates the primary surfaces of said first layer, said second layer, said third layer, said fourth layer, said fifth layer, said sixth layer, said seventh layer, said eighth layer, and said ninth layer to electrically connect said seventeenth metallic sheet with the output port of said second band-pass filter, an eleventh through-hole connecting metallic sheet that penetrates the primary surfaces of said first layer, said second layer, said third layer, said fourth layer, said fifth layer, said sixth layer, said seventh layer, and said eighth layer to electrically connect the second terminal of the third matching transmission line with said thirteenth metallic sheet, a ninth through-hole connecting metallic sheet that penetrates the primary surfaces of said ninth layer, said tenth layer, and said eleventh layer to electrically connect said thirteenth metallic sheet with said twenty-second metallic sheet, a thirteenth through-hole connecting metallic sheet that penetrates the primary surfaces of said twelfth layer and said thirteenth layer to electrically connect said twenty-second metallic sheet with said twenty-seventh metallic sheet, a seventh through-hole connecting metallic sheet that penetrates the primary surfaces of said fifth layer, said sixth layer, said seventh layer, and said eighth layer to electrically connect said fourteenth metallic sheet with said fourth metallic sheet, an eighth through-hole connecting metallic sheet that penetrates the primary surfaces of said fifth layer and said sixth layer to electrically connect said third metallic sheet with said seventh metallic sheet, a fifth through-hole connecting metallic sheet that penetrates the primary surfaces of said ninth layer and said tenth layer to electrically connect said fourteenth metallic sheet with said nineteenth metallic sheet, a twelfth through-hole connecting metallic sheet that penetrates the primary surface of said tenth layer to electrically connect said nineteenth metallic sheet with said seventeenth metallic sheet, a sixth through-hole connecting metallic sheet that penetrates the primary surfaces of said first layer, said second layer, said third layer, said fourth layer, said fifth layer, said sixth layer, said seventh layer, and said eighth layer to electrically connect said fourteenth metallic sheet with the output port of said third band-pass filter.

* * * * *